United States Patent [19]

Bauer et al.

[11] Patent Number: 5,391,036

[45] Date of Patent: Feb. 21, 1995

[54] MAGNETIC TRANSFER DEVICE

[75] Inventors: Tibor L. Bauer, Hopewell Junction; William A. Cavaliere, Verbank; David K. Green, Poughkeepsie; John P. Karidis, Ossining; David C. Linnell, Poughkeepsie, all of N.Y.

[73] Assignee: International Business Machines Corporation, Armonk, N.Y.

[21] Appl. No.: 31,520

[22] Filed: Mar. 15, 1993

[51] Int. Cl.$^6$ ............................................. B25J 15/06
[52] U.S. Cl. .................................. 414/225; 414/737; 901/40; 294/65.5; 221/212
[58] Field of Search ..................... 414/222, 225, 737; 901/40; 198/468.5; 294/65.5; 221/212

[56] References Cited

U.S. PATENT DOCUMENTS

| | | | |
|---|---|---|---|
| 531,384 | 12/1894 | Olson | 221/212 |
| 4,520,557 | 6/1985 | Harigane et al. | 29/740 |
| 4,554,610 | 11/1985 | Metz et al. | 361/144 |
| 4,813,729 | 3/1989 | Speckhart et al. | 294/65.5 |
| 4,829,855 | 5/1989 | Martinez | 294/65.5 X |
| 4,915,565 | 4/1990 | Bond et al. | 414/225 |
| 5,041,806 | 8/1991 | Enderle et al. | 335/295 |
| 5,154,333 | 10/1992 | Buaer et al. | 225/1 |
| 5,162,047 | 11/1992 | Wada et al. | 29/25.01 |

FOREIGN PATENT DOCUMENTS

| | | | |
|---|---|---|---|
| 0242065 | 3/1987 | European Pat. Off. | H01L 21/00 |
| 4130786 | 1/1992 | Japan | H01S 3/18 |
| 819997B | 4/1981 | U.S.S.R. | |

OTHER PUBLICATIONS

"Magnetic Pick-up Tool" by W. Betz et al., Publication of RCA, Princeton, N.J., S13040167, Apr. 15, 1970.
"Magnetic Handler" by A. Perini, IBM Technical Disclosure Bulletin, vol. 10, No. 7, Dec. 1967.
"Electro-Magnetic Laser Bar Manipulation", IBM Technical Disclosure Bulletin, vol. 34, No. 4A, Sep. 1991, p. 477.

*Primary Examiner*—Donald W. Underwood
*Attorney, Agent, or Firm*—Michael J. Balconi-Lamica

[57] ABSTRACT

A transfer device especially suitable for transferring a minute electronic component part from a first location and position to a second location and position, the component part having critical facet sides of high integrity and at least one non-critical side, is disclosed. The transfer device comprises a non-destructive engaging means, a control means, and a decoupling means, whereby the integrity of the essential facet sides of the component part is maintained.

16 Claims, 3 Drawing Sheets

MAGNETIC TRANSFER DEVICE

BACKGROUND OF THE INVENTION

1. Field of the Invention

The present invention generally relates to a transfer device and, more particularly, to a magnetic transfer device well suited for the handling of a minute electronic component part.

2. Discussion of the Related Art

Semiconductor laser devices are generally formed by dicing a laser bar into individual laser elements. The quality of the individual laser elements is dependent upon the integrity of the facet sides of the laser bar being diced. In general, laser bars are cleaved from a laser cell. An example of a material used in the manufacture of laser devices is GaAs. GaAs, which has a cuboidal crystal structure, is very brittle however. Thus, cleaving of GaAs laser bars is a key factor in the manufacture of GaAs laser devices.

Figure 1:
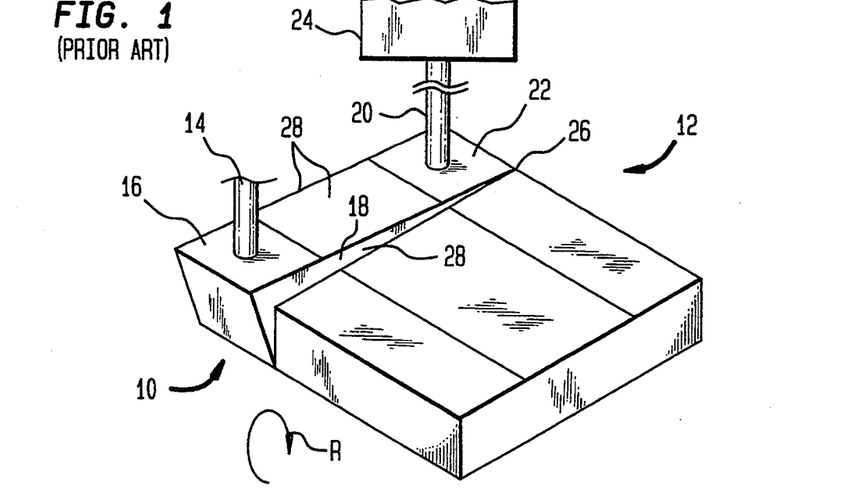
FIG. 1 shows an isometric view of a laser bar being cleaved from a cell.

An apparatus for producing high quality laser bars is a jaw cleaving device disclosed in commonly assigned U.S. Pat. No. 5,154,333. With reference now to FIG. 1, the jaw cleaving device (not shown) cleaves a laser bar 10 from a cell 12 according to the following. To begin, the cell 12 is mounted in the cleaving device. A first jaw 14 is then applied to a margin area 16 at one end of the laser bar 10 from which a cleavage 18 is to be propagated. A second jaw 20 is applied to a margin area 22 at an opposite end of the laser bar 10, the second jaw 20 further being provided with a weight 24 used as a biasing force to ensure separation of the laser bar 10 from the cell 12 along the same crystallographic plane 26. The cleaving device exerts a rotational force R upon the cell 12 to effectuate the cleaving of laser bar 10. Upon separation of the laser bar 10 from the cell 12, the laser bar 10 is ready for further processing. The laser bar 10 thus produced is of high quality and has facet sides 28 of high integrity.

The integrity of the facet sides 28 of the laser bar 10 must be maintained to avoid defects in subsequently formed laser devices. Defects in the facet side of a laser device, which can include a chipped or shingled surface, cause undesired dispersement of light by reflections, thereby lowering a total amount of useful light emanating from the laser. In addition, reflected light at a shingled surface causes heat generation which can lead to catastrophic optical damage. That is, portions of the laser's facet surface can break off due to heat damage. The integrity of the facet sides of the laser bar is thus very important in order to subsequently produce a high quality laser device free of defects.

In addition to producing cleaved laser bars having high quality facet sides, it is highly desirable to perform the cleaving in an ultra-high vacuum (UHV) environment, and more particularly, a UHV environment free of $O_2$ and $H_2O$. Exposure of the optical facet surfaces of the laser bar to $O_2$ and $H_2O$ results in the formation of an oxide layer upon the surfaces. Such an oxide layer absorbs light energy and causes diffusion of light. As discussed above, absorption of the light energy may result in catastrophic optical damage to the resultant laser device.

Subsequent to being cleaved, the laser bars are required to be transferred from the cleaving device to a carrier fixture in preparation for further processing. In view of the foregoing, the cleaved laser bars must be critically handled. In addition, due to the geometry of the laser bar and the UHV environment, the transferring of the laser bar becomes a critical step in the manufacturing of laser devices. In this regard, physical clamping devices are undesirable since any stresses exerted by the handling device would be detrimental to the integrity of the laser bar facet sides. The geometry of the cleaved laser bars are small in size, which can be on the order of 150 $\mu$m H $\times$ 750 $\mu$m W $\times$ 13.5 $\times 10^3$ $\mu$m D or of other minute dimensions as required to provide a desired wavelength of light from individual laser devices, and thus not well suited for being handled by a physical clamping device. In addition, the handling device should be capable of operating under a UHV environment. Prior techniques for handling laser bars, including the use of adhesives and vacuum hold tools, are unsuitable for use in the UHV environment. Specifically, a disadvantage of adhesives or the like is that they outgas under UHV pressure and would cause contamination of the laser bar surfaces. Likewise, vacuum suction tools could not be employed, since the vacuum suction tools would not have any suction pressure in the UHV environment.

There is thus needed a device which can critically handle cleaved laser bars and which is capable of operating in a UHV environment.

SUMMARY OF THE INVENTION

An object of the present invention is to provide a device for transferring a minute electronic component part from a first location and position to a second location and position, while maintaining the integrity of critical facet sides of the component part.

Another object of the present invention is to provide a transfer device which can operate in atmosphere and UHV, also.

According to the invention, a transfer device especially suitable for transferring a minute electronic component part from a first location and position to a second location and position, the component part having critical facet sides of high integrity and at least one non-critical side, comprises a means for engaging the component part non-destructively on the non-critical side thereof, wherein the engaging means is moveable along a transfer path between a home position and a decoupling position and further having an addressing position located in-between the home and decoupling positions. The addressing position is a position along the transfer path prior to an engagement position wherein the component part is engaged by said engaging means. A control means controls said engaging means, in sequence, to i) move said engaging means from the home position to the addressing position wherein said engaging means addresses the component part in the first location and position and ii) move said engaging means from the addressing position to the decoupling position whereby said engaging means engages the component part at the engaging position and transfers the same along the transfer path to the decoupling position. A decoupling means decouples the component part from said engaging means at the second location and position, said decoupling means physically contacting the component part on edge portions of the non-critical side thereof, whereby the integrity of the essential facet sides of the component part is maintained.

BRIEF DESCRIPTION OF THE DRAWINGS

The foregoing and other teachings of the present invention will become more apparent upon a detailed description of the best mode for carrying out the invention as rendered below. In the description to follow, reference will be made to the accompanying drawings, in which.

DETAILED DESCRIPTION OF THE PREFERRED EMBODIMENTS

Figure 2:
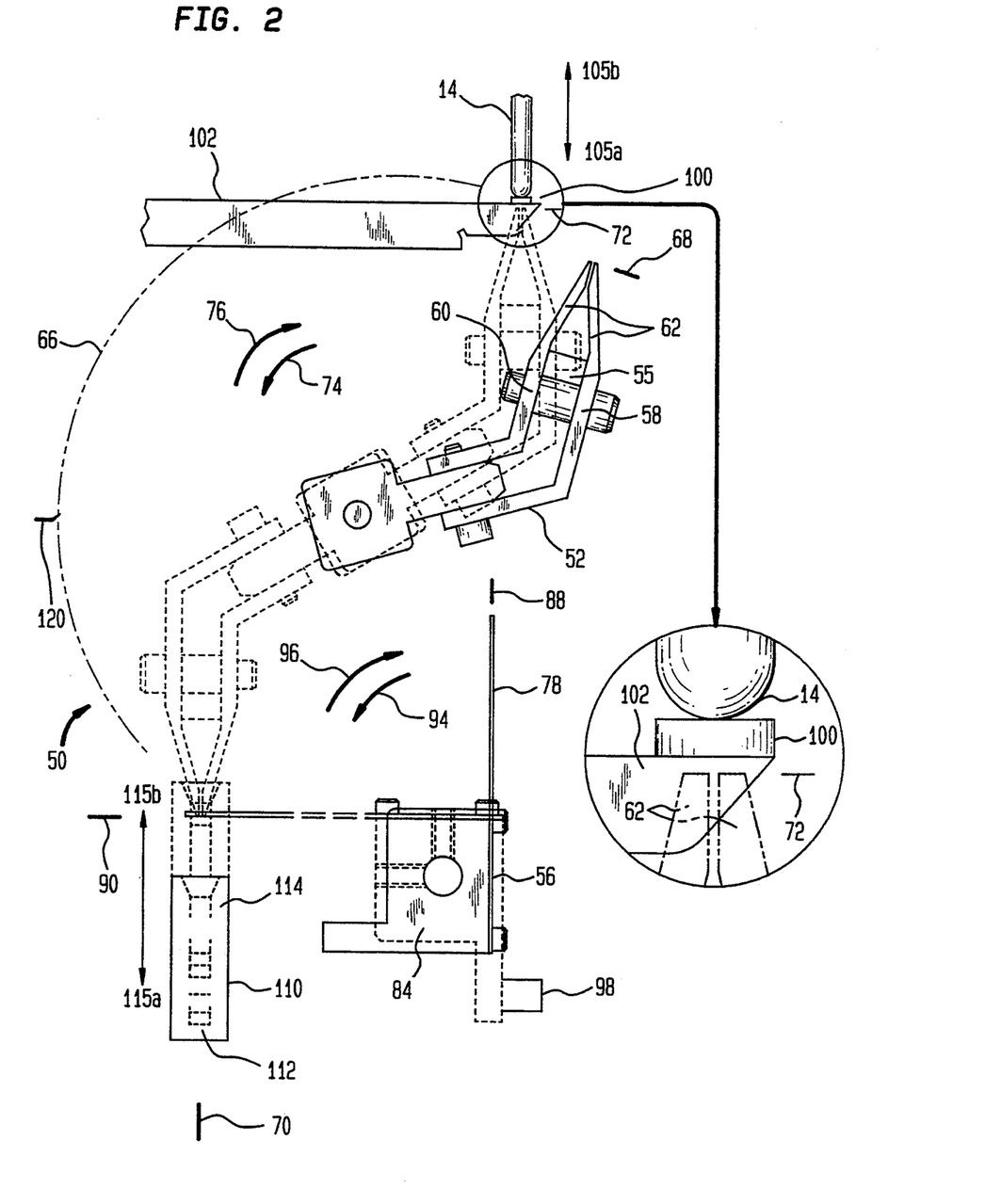
FIG. 2 shows a side perspective of a preferred embodiment of the present invention.
Figure 3:
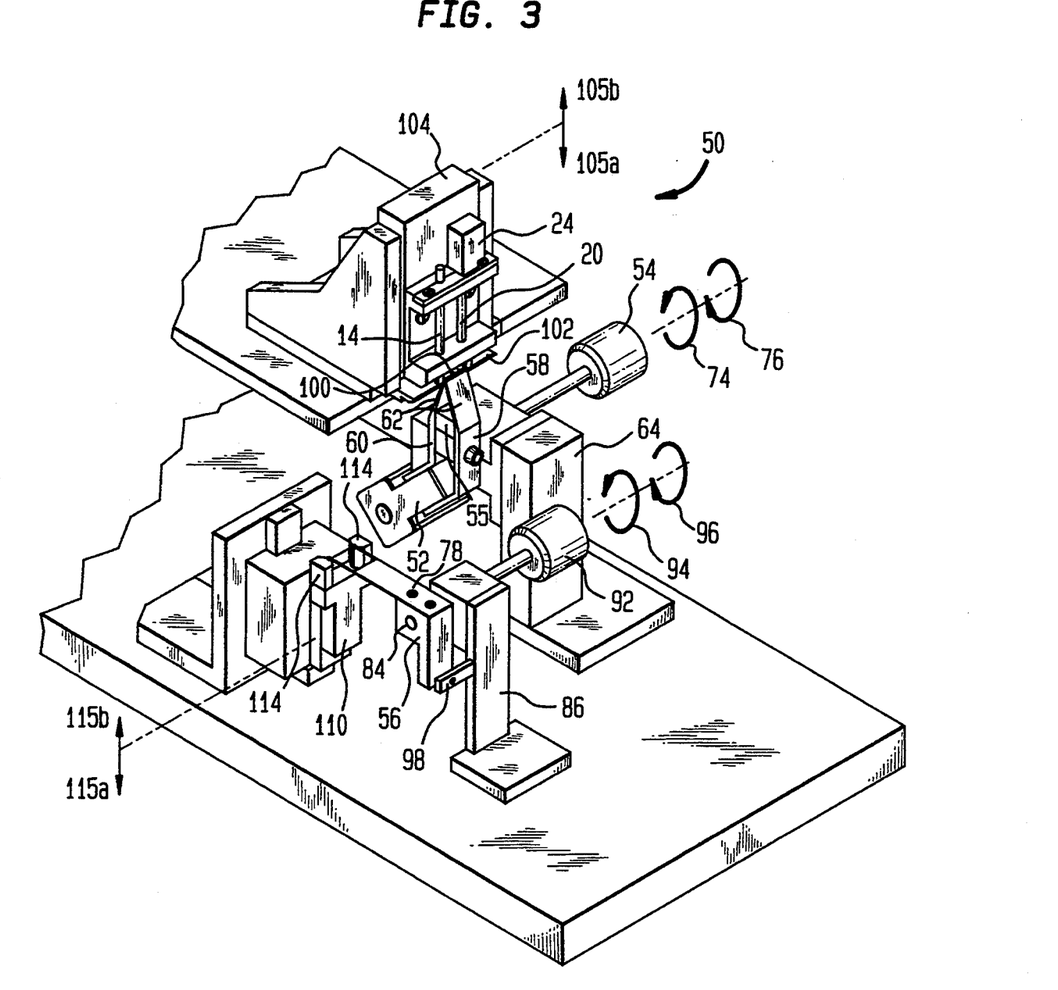
FIG. 3 shows an isometric view of the transfer device of the present invention.

Referring now to the drawings and more particularly, FIGS. 2 and 3, a transfer device 50 of the present invention for non-destructively transferring a minute electronic component part having critical facet sides of high integrity and at least one non-critical side, such as a laser bar, from a first position and location to a second position and location is shown. Transfer device 50 comprises an engaging means 52, a control means 54, and a decoupling means 56. Engaging means 52 comprises a magnet 55 having a south pole end and a north pole end thereof and further comprises a pair of magnetic transfer tips 58 and 60 in contact with the south pole end and north pole end of magnet 55, respectively. Magnet 55 comprises any high magnetic flux magnet of a desired size and shape. In instances where transfer device 50 is to be used in a UHV environment, magnet 55 is UHV compatible also. Preferably, magnet 55 comprises rare earth neodymium iron boron.

Magnetic transfer tips 58 and 60 comprise pieces of magnetic steel material, the pieces of material being in a desired shape. Magnetic transfer tips 58 and 60 preferably comprise elongated and substantially parallel pole pieces, each pole piece being tapered towards the other piece at engaging end portions 62 thereof. Magnetic transfer tips 58 and 60 are also heat treated, by any suitable heat treatment process known in the art, for reorienting the magnetic material thereof to have a flux path from end to end of each transfer tip. Heat treatment provides a desired flux path in the magnetic material of magnetic transfer tips 58 and 60.

Magnet 55 is secured between magnetic transfer tips 58 and 60 by suitable means, for example, an insulative spacer and a screw fastener. In addition, magnet 55 is positioned proximate to engaging end portions 62 of engaging means 52 and, more particularly, magnetic transfer tips 58 and 60. In the above arrangement, the magnetic flux of magnet 55 is modified by magnetic transfer tips 58 and 60 to provide a desired magnetic flux at engaging end portions 62 of engaging means 52.

The size and shape of magnetic transfer tips 58 and 60, in addition to the size and shape of magnet 55, are determined by the physical and magnetic requirements of a particular application, i.e., the size and shape of the workpiece being handled thereby and also the amount of magnetic material content of the workpiece. For example, for handling laser bars having a nickel layer of known thickness on a non-critical bottom side thereof, magnet 55 and magnetic transfer tips 58 and 60 of engaging means 52 are sized and shaped to provide sufficient flux for saturating the nickel layer. Changes to the size and shape of magnet 55 and magnetic transfer tips 58 and 60 can be made to meet the requirements of the particular transferring application, i.e., based upon the dimensions of the component part being transferred.

Referring again to FIGS. 2 and 3, engaging means 52 is further pivotally mounted on an engaging means support member 64 such that the engaging end portions 62 of engaging means 52 follow a desired arcuate transfer path 66 upon rotation of engaging means 52. The arcuate transfer path extends at least from a home position indicated by numeral 68 through a decoupling position indicated by numeral 70. The arcuate transfer path 66 includes an addressing position 72, to be described further herein below, the addressing position 72 being located in-between the home and decoupling positions 68 and 70, respectively.

Referring to FIG. 3, control means 54 comprises, for example, any suitable motor controlled rotational actuator connected to engaging means 52 for movement of engaging means 52 about the transfer path 66. Rotational actuator 54 enables movement of engaging means 52 in forward and reverse directions, indicated by arrows numbered 74 and 76, respectively, about path 66. Rotational actuator 54 further includes position sensors, or the like, (not shown) for enabling precise rotational control of the engaging means 52 between discrete positions, including home, decoupling, and addressing positions 68, 70, and 72, respectively, along the transfer path 66.

Decoupling means 56 comprises an elongated plate 78 having fingers 80 (see FIG. 5) extending from a decoupling end portion 82 of elongated plate 78. Elongated plate 78 is securely mounted by appropriate means, such as screw fasteners, upon a plate support member 84. Plate support member 84 is pivotally mounted to a decoupling means support member 86 for pivotal movement of decoupling means 56 between a storage position 88 and a decoupling position 90. A rotational actuator 92 is further connected to said plate support member for discrete pivotal movement control of the decoupling means 56. That is, decoupling means 56 can be controlled by the rotational actuator 92 for movement between storage and decoupling positions, 88 and 90, respectively. Alternatively, decoupling means 56 can be pivotally moved in forward or reverse directions, as indicated by arrows numbered 94 and 96, respectively. If desired, a mechanical stop 98 can be affixed to the decoupling means support member 86 for engagement with a portion of plate support member 84 to prevent pivotal movement of the decoupling means 56 beyond the decoupling position 90.

Figure 4:
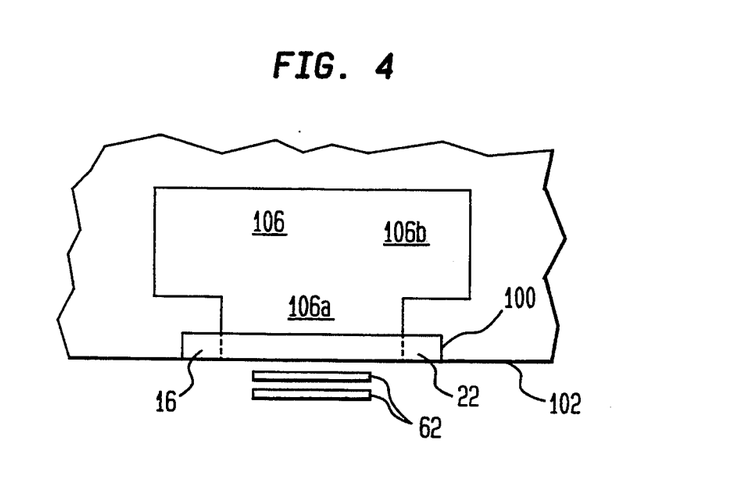
FIG. 4 shows a top perspective of a portion of the transfer device of the present invention.

Referring now to FIGS. 2, 3, and 4, a laser bar 100 is shown positioned and located upon a cleaving platform 102 subsequent to a cleaving operation but prior to any subsequent laser bar processing steps. A micropositioning stage 104 is used to lower and raise pole shaped jaws 14 and 20 between cleaving and release positions 105a and 105b, respectively, and wherein the positioning is controlled by a motor driven micrometer (not shown), for example. Jaw 14 is shown in the cleaving position 105a in FIG. 2. Cleaving platform 102 comprises a flat plate having an aperture 106 therein in alignment with transfer path 66. In particular, aperture 106 is characterized by first and second portions 106a and 106b, respectively. First portion 106a is of suitable dimension to allow the passing of the engaging end portion 62 of engaging means 52 therethrough. Second portion 106b is of suitable dimension to allow the passing of the engaging end portion 62 of engaging means 52 and the laser bar 100 therethrough.

Figure 5:
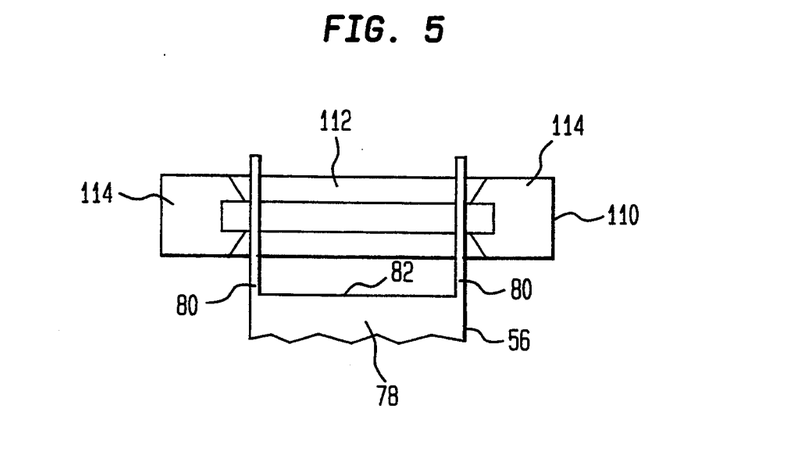
FIG. 5 shows a top perspective of another portion of the transfer device of the present invention.

Turning now to FIGS. 2, 3, and 5, a carrier fixture 110 is shown for receiving cleaved laser bars. The carrier fixture 110 is characterized by bottom and side portions 112 and 114, respectively. Side portions 114 are spaced apart from one another and include appropriately aligned slots on inside surfaces thereof for receiving cleaved laser bars therebetween. That is, the spacing between side portions 114 of carrier fixture 110 coincides with and is slightly larger than the length dimensions of the laser bars being cleaved. FIG. 5 shows a top view of carrier fixture 110 having a laser bar held therein and with decoupling means 56 in the decoupling position 90.

In operation, transfer device 50 transfers a cleaved laser bar 100 from a first location and position on a cleaving platform 102 to a second location and position at the decoupling position 70 on the transfer path 66 (see FIG. 2). Cleaved laser bar 100 is initially held in place on cleaving platform 102 by cleaving Jaws 14 and 20, subsequently from being cleaved. As discussed earlier, cleaving jaws 14 and 20 are designed to contact a laser bar in non-critical margin areas 16 and 22, respectively.

Engaging means 52 is initially positioned in the home position 68, and is moved by control means 54 in a forward direction 74 along transfer path 66 until it reaches addressing position 72. In the addressing position 72, engaging means 52 addresses laser bar 100 but is not yet in engaging contact therewith. More particularly, the magnetic flux provided at engaging end portions 62 of magnetic transfer tips 58 and 60 magnetically influences laser bar 100 such that laser bar 100 is prevented from moving during the releasing of the same by cleaving jaws 14 and 20. As indicated previously, laser bar 100 is comprised of at least some magnetic material therein or layered on a non-critical side thereof, the magnetic material comprising nickel, for example. In addition, in the addressing position 72, the engaging end portions 62 of engaging means 52 are designed to be substantially parallel with the non-critical surface of laser bar 100 (see FIG. 2). Maintaining of the engaging end portions 62 substantially parallel with laser bar 100 while in the addressing position 72 facilitates subsequent parallel engagement between the same.

Cleaving jaws 14 and 20 are then controlled by micropositioning stage 104 to move from the cleaving position 105a to the releasing position 105b, thereby releasing their hold on laser bar 100. As a result of engaging means 52 being in the addressing position 72, laser bar 100 remains in the first position and location and does not move. The integrity of the first position and location is thereby advantageously maintained. Engaging means 52 is thereafter moved by control means 54 further along the transfer path 66 in the forward direction 74. Engaging end portions 62 of engaging means 52 pass through aperture portion 106a of cleaving platform 102 to engage the bottom non-critical surface of laser bar 100 in a parallel manner at an engaging position. No disadvantageous tilting or disorientation of the laser bar 100 occurs upon engagement of the same by the engaging means 52 as a result of the parallel engagement therebetween. Laser bar 100 is thereafter lifted off cleaving platform 102 and passes through aperture portion 106b along the transfer path 66. Control means 54 continues movement of engaging means 52 along the transfer path 66 until engaging means 52 reaches a desired second position and location along the transfer path. Preferably, the second position and location corresponds to decoupling position 70 of engaging means 52. In other words, when engaging means 52 is in decoupling position 70, laser bar 100 is precisely positioned and located in the second position and location. As a result of non-destructively engaging laser bar 100 on the non-critical side, the integrity of the critical facet sides of laser bar 100 are advantageously maintained.

While in the second position and location corresponding to decoupling position 70 of engaging means 52, laser bar 100 is ready to be decoupled from engaging means 52. Carrier fixture 110 is moved from its storage position 115a to the decoupling position 115b, by any suitable moving means such as a motorized micropositioning stage (not shown), for receiving laser bar 100. More particularly, carrier fixture 110 moves a predetermined amount from its storage position 115a to the decoupling position 115b, the predetermined amount being an amount according to the number of laser bars already present in the carrier fixture 110, and further wherein the carrier fixture 110 is designed for receiving a predetermined number of laser bars. For example, if no laser bars are present in the carrier fixture 110 and the carrier fixture is designed for receiving ten laser bars, then carrier fixture 110 is moved a maximum amount, equal to at least the height of ten laser bars, into the decoupling position 115b so that the cleaved laser bar 100 engaged by engaging means 52 will be in close proximity above, but not yet resting upon, the bottom inside surface of carrier fixture 110. In the instance where there are laser bars already contained in carrier fixture 110, the carrier fixture is moved into the decoupling position 115b so that the laser bar 100 will be in close proximity above, but not yet resting upon, the uppermost laser bar contained in carrier fixture 110. Laser bar 100 is thus received in carrier fixture 110 but not yet disengaged from the engaging means 52.

With engaging means 52 and carrier fixture 110 in the decoupling positions 70 and 115b, respectively, decoupling means 56 is moved via rotational actuator 92 in a forward direction 94 from the decoupling means storage position 88 to decoupling position 90 of the decoupling means 56. Just prior to reaching decoupling position 90 of the decoupling means 56, decoupling fingers 80 contact the non-critical bottom surface of laser bar 100. Upon reaching decoupling position 90, decoupling means 56 decouples or disengages laser bar 100 from engaging means 52. While engaging means 52 and decoupling means 56 are in their respective decoupling positions, 70 and 90, laser bar 100 is addressed by the magnetic flux provided at engaging end portions 62 of magnetic transfer tips 58 and 60 of engaging means 52. Laser bar 100 is thereby held in a disengaged position against contacting portions of fingers 80 of decoupling means 56. Upon reverse movement of engaging means 52 in direction 76 along transfer path 66, laser bar 100 is released from the magnetic flux of engaging means 52 and gently glides to rest in position within carrier fixture 110 (i.e., either at the bottom of the carrier fixture when no other laser bars are present, or on top of the uppermost laser bar when at least one other laser bar is present). Engaging means 52 is preferably moved back to the home position in preparation for a subsequent laser bar transfer. In addition, decoupling means 56 can then be moved in reverse direction 96 from decoupling position 90 to storage position 88. No scrubbing or adverse abrasions occur in the release of laser bar 100 from engaging means 52.

Upon decoupling and release from engaging means 52 and because of the extreme low mass of laser bar 100, laser bar 100 gently glides into position within carrier fixture 110. Mechanical mass and inertia of the handling and manipulating mechanisms of transfer device 50, with respect to their effect on laser bar 100, are advantageously eliminated (i.e., no scrubbing, no twisting, and no undue stresses induced). In other words, a minimum amount of stress is induced on laser bar 100 and therefore provides a higher quality laser bar for subsequent processing into individual laser devices. In addition, the speed of transferring a laser bar is not restricted by the transfer device 50. The mass of the individual laser bar is the only inertia which the part endures. Movement of laser bar 100 is thus advantageously controlled. Furthermore, upon decoupling and release from engaging means 52, laser bar 100 is precisely located within carrier fixture 110 and ready for further processing. A desired number of laser bars may be cleaved and transferred into the carrier fixture 110 by transfer device 50, up to the maximum capacity of carrier fixture 110.

In an alternate embodiment of the present invention which is substantially similar to the preferred embodiment, a third position and location, corresponding to a processing position and location, along arcuate transfer path 66, such as that indicated by the numeral 120, for example (see FIG. 2), is included. While only one processing position and location has been shown, other positions and locations along path 66 are possible. The transfer device 50 of the alternate embodiment operates similarly as in the preferred embodiment, however, engaging means 52 additionally stops at processing position and location 120. In the processing position, the component part or laser bar 100 being transferred can be easily processed by a processing means (not shown) while being held in a desired position and location by the engaging means 52. This is very advantageous for use in a UHV environment, since transfer device 50 can be made UHV compatible. An example of further processing may include any suitable well known facet coating step, such as, passivating a desired facet side or sides of laser bar 100 with a thin passivation layer. Where the processing step is a line-of-sight process, the components of transfer device 50 can be easily shielded from being coated during the processing step. Other examples of processing may include deposition type surface modifications or the placement of the laser bar into a loading position for loading the same into a suitable carrier.

Yet another alternate embodiment of the present invention, which is substantially similar to the preferred embodiment except for the following differences, comprises transferring laser bar 100 from a first position and location to a second position and location. In this second alternate embodiment, the first position and location corresponds to the laser bar 100 being stored in carrier fixture 110, the carrier fixture being in the decoupling position and location 115b. The second position and location corresponds to the processing position and location 120 along arcuate transfer path 66. While only one processing position and location 120 has been shown, other positions and locations along path 66 are possible. In operation, the second alternate embodiment operates, similarly as in the preferred embodiment, as follows. One or more laser bars 100 are initially stored in carrier fixture 110, the carrier fixture 110 acting as a supply fixture. The decoupling step of the preferred embodiment is performed in reverse order to couple an uppermost positioned laser bar 100 contained in carrier fixture 100 to engaging means 52.

More particularly, carrier fixture 110 containing a laser bar 100 is moved from its storage position 115a to the position 115b (see carrier fixture 110 as shown in dashed lines in FIG. 2). Decoupling means 56, acting in a coupling mode, is moved from its home position 88 to position 90 in a forward direction indicated by arrow 94 of FIG. 2. Elongated plate 78 having fingers 80 extending from the end portion 82 thereof, is thereby moved from the vertical position (as shown in solid in FIG. 2) to the horizontal position (as shown in dashed lines in FIG. 2). Fingers 80 are thereby positioned above the uppermost laser bar 100 contained in carrier fixture 110 (as shown in FIG. 5 and further as shown in FIG. 2). The process of coupling of the laser bar 100 to engaging means 52 continues by the movement of engaging means 52 from its home position 68, in the forward direction as indicated by arrow 74, to the decoupling position 70, wherein decoupling position 70 acts as a coupling position during the coupling mode (See engaging means 52 as it points in a downward direction at decoupling position 70 as shown by dashed lines in FIG. 2). At this point in time, engaging means 52 magnetically addresses laser bar 100, wherein laser bar 100 is held in physical contact on the non-critical side thereof with contacting portions of the undersides of fingers 80 of elongated plate 78 of decoupling means 56, but not yet in engagement with the engaging means 52. Upon reverse movement of decoupling means 56 (acting in the coupling mode) from the position 90 to the storage position 88, engagement of the laser bar 100 with engaging means 52 is facilitated. That is, the laser bar 100 remains coupled to the means 56 as the means 56 moves to its storage position 88, the coupling resulting from the magnetic influence by the engaging means 52 upon the laser bar 100, and further wherein the laser bar 100 remains coupled to means 56 until the laser bar 100 is engaged with engaging means 52. Once laser bar 100 is engaged with engaging means 52, carrier fixture 110 is moved to its storage position 115a (See fixture 110 as shown by solid lines in FIG. 2). Once laser bar 100 is engaged by engaging means 52, it is thereafter transferred along transfer path 66 to a second position and location, such as, processing position and location 120. Processing can be performed as indicated above with reference to the alternate embodiment. Subsequent to processing, laser bar 100 is then transferred back to decoupling position and location 70 for being decoupled into the same carrier fixture or another carrier fixture for receiving processed laser bars. In this later instance, the carrier fixture for supplying laser bars is exchanged for the carrier fixture for receiving processed laser bars and vice versa until all supplied laser bars are processed. For example, the respective carrier fixtures could be releasably mounted upon a rotatable platform for alternating between supply and processed positions, the platform further being positionable, as necessary, to position the desired carrier fixture in either storage or decoupling positions, 115a and 115b, respectively.

There has thus been shown a transfer device for transferring a laser bar from the first position and location to the second position and location. The integrity of critical facet sides of the laser bar is advantageously maintained as a result of the non-destructive engaging means. No physical clamping means are employed for transferring the laser bar. Furthermore, the transfer device is suitable for use in atmosphere and UHV, since the transfer device 50 neither produces nor provides sources of contaminants.

While the invention has been particularly shown and described with reference to the preferred embodiment thereof, it will be understood by those skilled in the art that various changes in form and detail may be made therein without departing from the spirit and scope of the invention. For example, a single controller, such as a computer controller, could be used for automatically controlling operation of the transfer device in combination with a laser bar cleaving device. In addition, all components of the transfer device can be UHV compatible for operation in a UHV environment.

What is claimed is:

1. A transfer device especially suitable for transferring a minute electronic component part along a transfer path from a first location and position to a second location and position, the component part having critical facet sides of high integrity and at least one non-critical sider said device comprising:

means for engaging the component part non-destructively on the non-critical side thereof, said engaging means being moveable along the transfer path between a home position and a decoupling position and further having an addressing position located inbetween the home and decoupling positions, the addressing position being a position along the transfer path prior to an engagement position wherein the component part, being in the first location and position, is engaged by said engaging means, further wherein said engaging means comprises a magnet having a south pole end and a north pole end thereof and further comprises a pair of magnetic transfer tips in contact with the south pole end and north pole end of the magnet, respectively, said engaging means further being pivotally mounted upon a support for pivotal movement about the transfer path between the home and decoupling positions;

means for controlling said engaging means, in sequence, to i) move said engaging means from the home position to the addressing position wherein said engaging means addresses the component part in the first location and position and ii) move said engaging means from the addressing position to the decoupling position whereby said engaging means engages the component part at the engagement position and transfers the same along the transfer path to the decoupling position; and means for decoupling the component part from said engaging means at the second location and position, said decoupling means physically contacting the component part on edge portions of the non-critical side thereof, whereby the integrity of the essential facet sides of the component part is maintained.

2. The transfer device of claim 1, further wherein the pair of magnetic transfer tips comprise two elongated and substantially parallel pole pieces, each pole piece being tapered along the elongated dimension towards the other pole piece at ends thereof which engage the component part.

3. The transfer device of claim 1, wherein said engaging means is moveable along the transfer path, the transfer path comprising an arcuate transfer path, and wherein an engaging end portion of said engaging means is substantially parallel to the non-critical side of the component part when said engaging means is in the addressing position, and further wherein the engaging end portion engages the non-critical side of the component part in a parallel manner.

4. A transfer device especially suitable for transferring a minute electronic component part along a transfer path from a first location and position to a second location and position, the component part having critical facet sides of high integrity and at least one non-critical side, the component part further being supported at the first location and position upon a platform at edge portions of the at least one non-critical side, said device comprising:

first means for releasably engaging the component part at the first location and position, said first engaging means being operable i) for releasably engaging the component part at non-essential edge portions thereof and ii) for disengaging the component part to release engagement therefrom;

second means for engaging the component part non-destructively on the non-critical side thereof, said second engaging means being moveable along the transfer path between a home position and a decoupling position and further having an addressing position located in-between the home and decoupling positions, the addressing position being a position along the transfer path prior to an engagement position wherein the component part, being in the first location and position, is engaged by said second engaging means, further wherein said second engaging means comprises a magnet having a south pole end and a north pole end thereof and further comprises a pair of magnetic transfer tips in contact with the south pole end and north pole end of the magnet, respectively, said second engaging means further being pivotally mounted upon a support for pivotal movement about the transfer path between the home and decoupling positions;

means for controlling said first and second engaging means in sequence to i) move said second engaging means from the home position to the addressing position wherein said second engaging means magnetically addresses the component part in the first location and position, ii) disengage said first engaging means to release the component part therefrom, wherein the component part is held in place as a result of the addressing thereof by said second engaging means, and iii) move said second engaging means from the addressing position to the decoupling position whereby said second engaging means engages the component part at the engagement position and transfers the component part along the transfer path to the decoupling position; and means for decoupling the component part from said second engaging means at the second location and position, said decoupling means physically contacting the component part on edge portions of the non-critical side thereof, whereby the integrity of the essential facet sides of the component part is maintained.

5. The transfer device of claim 4, further wherein the pair of magnetic transfer tips comprise two elongated and substantially parallel pole pieces, each pole piece being tapered along the elongated dimension towards the other pole piece at ends thereof which engage the component part.

6. The transfer device of claim 4, wherein said engaging means is moveable along the transfer path, the transfer path comprising an arcuate transfer path, and wherein an engaging end portion of said engaging means is substantially parallel to the non-critical side of the component part when said engaging means is in the addressing position, and further wherein the engaging end portion engages the non-critical side of the component part in a parallel manner.

7. A transfer device especially suitable for transferring a minute electronic component part along a transfer path from a first location and position to a second location and position, the component part having critical facet sides of high integrity and at least one non-critical side, said device comprising:
  means for engaging the component part non-destructively on the non-critical side thereof, said engaging means being moveable along the transfer path, the transfer path having a home position and further having an addressing position, the addressing position being a position along the transfer path prior to an engagement position wherein the component part, being in the first location and position, is engaged by said engaging means, further wherein said engaging means comprises a magnet having a south pole end and a north pole end thereof and further comprises a pair of magnetic transfer tips in contact with the south pole end and north pole end of the magnet, respectively, said engaging means further being pivotally mounted upon a support for pivotal movement about the transfer path; and
  means for controlling said engaging means, in sequence, to i) move said engaging means from the home position to the addressing position wherein said engaging means magnetically addresses the component part in the first location and position and ii) move said engaging means from the addressing position to the second location and position whereby said engaging means engages the component part at the engagement position and transfers the same along the transfer path to the second location and position, and further whereby the integrity of the essential facet sides of the component part is maintained.

8. The transfer device of claim 7, further wherein the pair of magnetic transfer tips comprise two elongated and substantially parallel pole pieces, each pole piece being tapered along the elongated dimension towards the otherpole piece at ends thereof which engage the component part.

9. The transfer device of claim 7, wherein said engaging means is moveable along the transfer path, the transfer path comprising an arcuate transfer path, and wherein an engaging end portion of said engaging means is substantially parallel to the non-critical side of the component part when said engaging means is in the addressing position, and further wherein the engaging end portion engages the non-critical side of the component part in a parallel manner.

10. The transfer device of claim 7, wherein
  said control means further controlling said engaging means to iii) move said engaging means from the second location and position to a third location and position along the transfer path, and said device further comprising:
  means for decoupling the component part from said engaging means at the third location and position, the third location and position corresponding to a decoupling position along the transfer path, said decoupling means physically contacting the component part on edge portions of the non-critical side thereof, whereby the integrity of the essential facet sides of the component part is further maintained.

11. The transfer device of claim 10, further wherein the pair of magnetic transfer tips comprise two elongated and substantially parallel pole pieces, each pole piece being tapered along the elongated dimension towards the other pole piece at ends thereof which engage the component part.

12. The transfer device of claim 10, wherein said engaging means is moveable along the transfer path, the transfer path comprising an arcuate transfer path, and wherein an engaging end portion of said engaging means is substantially parallel to the non-critical side of the component part when said engaging means is in the addressing position, and further wherein the engaging end portion engages the non-critical side of the component part in a parallel manner.

13. A transfer device especially suitable for transferring a minute electronic component part along a transfer path from a first location and position to a second location and position, the component part having critical facet sides of high integrity and at least one non-critical side, said device comprising:
  means for engaging the component part non-destructively on the non-critical side thereof, said engaging means being moveable along the transfer path, the transfer path having a home position and further having an engagement position, said engaging means further comprising i) a magnet having a south pole end and a north pole end thereof, ii) a pair of magnetic transfer tips in contact with the south pole end and north pole end of the magnet, respectively, and iii) being pivotally mounted upon a support for pivotal movement about the transfer path;
  means for coupling the component part to said engaging means at the engagement position, said coupling means being moveable between storage and coupling positions, said coupling means physically contacting the component part on edge portions of the non-critical side thereof when said engaging means is in the engagement position and said coupling means is in the coupling position, the component part being held in physical contact with said coupling means by a magnetic influence of said engaging means; and
  means for controlling said engaging means and said coupling means, in sequence, to i) move said coupling means from the storage position to the coupling position, ii) move said engaging means from the home position to the engagement position wherein said engaging means magnetically addresses the component part in the first location and position, iii) move said coupling means from the coupling position to the storage position to thereby facilitate magnetic engagement of the component part with said engaging means, the component part remaining coupled to said coupling means as said coupling means moves to the storage position, such coupling as a result of the magnetic influence by said engaging means upon the component part, wherein the component part remains coupled to said coupling means until the component parts engaged with said engaging means, and iv) move said engaging means from the engagement position to the second location and position along the transfer path whereby said engaging means transfers the component part along the transfer path to the second location and position, whereby the integrity of the essential facet sides of the component part is maintained.

14. The transfer device of claim 13, further wherein the pair of magnetic transfer tips comprise two elongated and substantially parallel pole pieces, each pole piece being tapered along the elongated dimension towards the other pole piece at ends thereof which engage the component part.

15. The transfer device of claim 13, wherein
said control means further controlling said engaging means to iii) move said engaging means from the second location and position to a third location and position along the transfer path.

16. The transfer device of claim 15, further wherein:
the third location and position corresponds to a decoupling position and said coupling means further decouples the component part from said engaging means at the third location and position.

* * * * *